（12）United States Patent
Nishiura et al.

(10) Patent No.: US 6,222,274 B1
(45) Date of Patent: Apr. 24, 2001

(54) BONDING WIRE LOOP SHAPE FOR A SEMICONDUCTOR DEVICE

(75) Inventors: Shinichi Nishiura, Fussa; Tooru Mochida, Higashiyamato, both of (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/178,709

(22) Filed: Oct. 26, 1998

(30) Foreign Application Priority Data

Oct. 27, 1997 (JP) .................................................... 9-311470

(51) Int. Cl.⁷ ........................... H01L 23/48; H01L 23/28; H01R 9/00
(52) U.S. Cl. ...................... 257/776; 257/775; 257/784; 257/666; 257/696; 257/780; 438/617
(58) Field of Search .................................... 257/779–787, 257/666, 676, 678, 692, 698, 784, 776, 775; 438/617

(56) References Cited

U.S. PATENT DOCUMENTS

| | | | |
|---|---|---|---|
| 5,468,999 | * 11/1995 | Lin et al. | 257/784 |
| 5,545,912 | * 8/1996 | Ristic et al. | 257/417 |
| 5,606,196 | * 2/1997 | Lee et al. | 257/503 |
| 5,736,792 | * 4/1998 | Orcutt | 257/783 |
| 5,917,235 | * 6/1999 | Imura | 257/669 |
| 5,950,100 | * 9/1999 | Shingai | 438/617 |
| 6,015,723 | * 1/2000 | Choi | 438/123 |
| 6,031,281 | * 2/2000 | Kang et al. | 257/692 |
| 6,034,440 | * 3/2000 | Ball | 257/786 |
| 6,040,633 | * 3/2000 | Manteghi | 257/784 |
| 6,048,744 | * 4/2000 | Corisis et al. | 438/15 |
| 6,049,976 | * 4/2000 | Khandros | 29/843 |

FOREIGN PATENT DOCUMENTS

| H4-318943 | 11/1992 | (JP) . |
|---|---|---|
| H5-60657 | 9/1993 | (JP) . |

\* cited by examiner

Primary Examiner—Alexander O. Williams
(74) Attorney, Agent, or Firm—Koda & Androlia

(57) ABSTRACT

A semiconductor device with wires mounted thereon, each one of the wires, which connects a first bonding point and a second bonding point which are positioned substantially in a lateral relationship, including: a neck height part which extends more or less vertically upward from the first bonding point, a first lateral wire part which extends laterally while dipping downward from the neck height part, a second lateral wire part which extends more or less horizontally from the first lateral wire part, a third lateral wire part which extends while rising from the second lateral wire part, and an inclined part which extends from the third lateral wire part to the second bonding point. Kinks are formed at portions connecting the neck height part, first lateral wire part, second lateral wire part, third lateral wire part and inclined part

2 Claims, 5 Drawing Sheets

BONDING WIRE LOOP SHAPE FOR A SEMICONDUCTOR DEVICE

BACKGROUND OF THE INVENTION

1. Field of the Invention

The present invention relates to a semiconductor device and also to a wire bonding method which connects first and second bonding points by a wire, and in particular, to a wire loop formation method.

2. Prior Art

The manufacture of a semiconductor device includes a process in which, as shown in FIGS. 3(a) and 3(b), a pad 2a (first bonding point) on a semiconductor chip 2 mounted on a lead frame 1 and a lead 1a (second bonding point) on the lead frame 1 are connected by a bonding wire (called merely "wire") 3. The loop shape of the wire 3 in this case may be a trapezoidal loop shape as shown in FIG. 3(a) or a triangular loop shape as shown in FIG. 3(b).

Wire loop formation methods of this type are described in, for example, Japanese Patent Application Publication (Kokoku) No. H5-60657 and Japanese Patent Application Laid-Open (Kokai) No. H4-318943.

The trapezoidal loop shape of FIG. 3(a) is formed by the process shown in FIG. 4.

In step (a), a capillary 4 is lowered so that a ball (not shown) formed on the tip end of the wire 3 that passes through the capillary 4 is bonded to a first bonding point A. This is done while a damper (not shown), which is located above the capillary 4 and can hold the wire when closed and feed the wire when opened, is opened. After the bonding to point A, the capillary 4 is raised to point B, delivering the wire 3.

Next, as seen in step (b), the capillary is moved horizontally in the opposite direction from the second bonding point G to point C. Generally, to move the capillary 4 in the direction opposite from the second bonding point G (for forming a loop in the wire) is referred to as a "reverse operation". Because of this reserve operation, the wire 3 assumes a shape that extends from point A to point C; and as a result, a kink 3a is formed in a portion of the wire 3. The wire 3 delivered in the process from point A to point C forms the neck height portion 31 of the loop shown in FIG. 3(a).

Next, in step (c), the capillary 4 is raised to point D while delivering the wire 3.

Afterward, as shown in step (d), the capillary 4 is again moved horizontally to point E in the opposite direction from the second bonding point G, i.e., another (or second) reverse operation is performed. As a result, the wire 3 assumes a shape inclined from point C to point E, and a kink 3b is formed in a portion of the wire 3. The wire 3 delivered out of the capillary 4 in the process from point C to point E forms the trapezoidal length portion 32 shown in FIG. 3(a).

Furthermore, in step (e), the capillary 4 is raised to point F while delivering the wire 3. The amount of wire 3 delivered is equal to the inclined portion 33 shown in FIG. 3(a). Afterward, the damper (again, not shown) is closed. Once the damper is closed, the wire 3 is not delivered even if the capillary 4 subsequently is moved.

As shown in steps (f) and (g), the capillary 4 performs a circular-arc motion (or a circular-arc motion followed by a straightly lowering motion) so that the capillary 4 is positioned at the second bonding point G, and the wire 3 is bonded to the second bonding point G, thus connecting the first and second bonding points A and G.

On the other hand, the triangular loop shape of FIG. 3(b) is formed by the process shown in FIG. 5.

In this triangular loop formation, the trapezoidal length portion 32 described in the trapezoidal loop formation process is not formed. Accordingly, the second reverse operation in step (d) in FIG. 4 is not performed. Thus, the steps (c), (d) and (e) in FIG. 4 are replaced by the single process as shown in step (c) of FIG. 4. In other words, the steps (a) and (b) are the same as the steps (a) and (b) shown in FIG. 5, respectively; and after the first reverse operation in step (b) of FIG. 5, the capillary 4 is raised to point F while delivering the wire 3 in step (c). Afterward, the capillary 4 performs the steps (d) and (e) in the same manner as the operations done in the steps (f) and (g) shown in FIG. 4, and the wire 3 is bonded to the second bonding point G.

As seen from the above, the triangular loop formation shown in FIG. 5 is simpler than the trapezoidal loop formation shown in FIG. 4 and is therefore advantageous in that the loop formation is performed in a shorter time. However, in cases where the height difference between the first bonding point A and the second bonding point G is large, or if there is a large distance between the first bonding point A and the edge portion of the semiconductor chip 2, then the wire 3 of the triangular wire loop shape as shown in FIG. 3(b) tends to come into contact with the edge portion of the semiconductor chip 2. In such cases, the trapezoidal wire loop formation is employed so that the contact between the wire 3 and semiconductor chip 2 can be avoided.

In the trapezoidal loop formation process shown in FIG. 4, the first reverse operation shown in step (b) is performed with the capillary 4 at a height close to the height of the first bonding point A. Accordingly, the kink 3a is relatively strong. However, the second reverse operation shown in step (d) is performed with the capillary 4 in a high position which is vertically far away from the first bonding point A. Accordingly, the kink 3b is difficult to form and is unstable. As a result, the portion of the wire near the kink 3b (see FIG. 3(a)) tends to be unstable and has a weak shape-retaining strength; as a result, this portion of the wire near the kink 3b may rise up or drop down. If the shape-retaining strength of the portion of the wire near the kink 3b is weak, then the wire is likely to bend when pressure from the outside is applied thereon. For instance, wire bending may easily occur when the capillary comes into contact with the second bonding point or when the impact by the ultrasonic oscillation is applied on the second bonding point. Such a wire bending can also occur when the wire vibrates or when the molding material flows during the process of injection of a molding material.

However, in the trapezoidal loop shape shown in FIG. 3(a) as well, as shown in FIG. 6, the following problem has been encountered if the height H of the loop is low, e.g., approximately 250 microns or less, and if the loop has a long wire length, i.e., in cases where (for example) the distance L between the first bonding point A and the second bonding point G is approximately 5 mm.

In particular, FIG. 7 shows a conventional trapezoidal loop formation process. The steps (a) through (e) correspond respectively to the steps (a) through (e) in FIG. 4. As shown in step (a), the capillary 4 is lowered so that the ball formed on the tip end of the wire is bonded to the first bonding point A, after which the capillary 4 is raised to point B and the wire 3 is delivered. Next, as shown in step (b), the capillary 4 is moved horizontally to point C in the opposite direction from the second bonding point G; in other words, a reverse operation is performed in step (b). As a result, a kink 3a is formed in the wire 3.

Next, as shown in step (c), the capillary 4 is raised to point D1, delivering the wire 3. Afterward, in step (d), the capillary 4 is again moved horizontally by a slight amount to point E1 in the opposite direction from the second bonding point G; in other words, another reverse operation is performed. As a result, a kink 3b is formed in the wire 3.

In cases where the wire length is short as shown in step (a) in FIG. 3, then the amount of wire 3 delivered in the step (c) in FIG. 4 may also be short. Accordingly, the kink 3b (see step (e) in FIG. 4) is formed by the reverse operation shown in step (d) in FIG. 4. However, in cases where the wire length is long as shown in FIG. 6, the amount of wire 3 delivered in step (c) in FIG. 7 is long. As a result, when the reverse operation shown in step (d) is performed, an excess amount of wire is delivered as a result of the tension on the wire 3 in the direction of the first bonding point A and the weight of the wire 3 itself. Accordingly, a bow 34 is formed in the wire 3, and the shape of the kink 3b is rounded, or no kink 3b is formed, resulting in a lack of sharp bend in the wire.

Even in the case of the kink 3b which is rounded as described above, such a round kink would not cause any problem when the distance between the edge 2b of the semiconductor chip 2 shown in FIG. 6 and the second bonding point G is as long as, for instance, 500 microns. However, in cases where the distance between the edge 2c of the semiconductor chip 2 and the second bonding point G is short, for instance, 300 microns or less, as indicated by the dotted line, then the wire 3 contacts the edge 2c of the semiconductor ship 2.

SUMMARY OF THE INVENTION

Accordingly, the primary object of the present invention is to solve the problems of trapezoidal wire loops described above.

It is another object of the present invention to provide a semiconductor device that has a wire loop which is stable in shape and has a high shape-retention force It is still another object of the present invention to provide a wire bonding method that forms such a wire loop.

The above objects are accomplished by a unique structure of a semiconductor device that has a wire loop between a first bonding point and a second bonding point, and the semiconductor device comprises: a neck height part which extends substantially vertically upward from the first bonding point, a first lateral wire part which extends laterally while dipping downward from the neck height part, a second lateral wire part which extends substantially horizontally from the first lateral wire part, a third lateral wire part which extends while rising from the second lateral wire part, and an inclined part which extends from the third lateral wire part to the second bonding point.

In this structure, kinks are respectively formed in the portion between the neck height part and first lateral wire part, in the portion between the first lateral wire part and second lateral wire part, in the portion between the second lateral wire part and third lateral wire part, and in the portion between the third lateral wire part and the inclined part.

In addition, the above-described objects of the present invention are accomplished by a unique wire bonding method in which a first bonding point and a second bonding point are connected by a bonding wire delivered by a capillary, and the method comprises: a process for bonding the bonding wire to the first bonding point; a process for performing a first reverse operation in which the capillary is raised slightly from the first bonding point and then moved slightly in the opposite direction from the second bonding point; a process for raising the capillary and then moving the capillary toward the second bonding point; a process for performing a second reverse operation in which the capillary is raised, moved toward the second bonding point, raised again and then moved in the opposite direction from the second bonding point; and a process for raising the capillary, moving the capillary to the second bonding point and then connecting the wire to the second bonding point.

BRIEF DESCRIPTION OF THE DRAWINGS

FIG. 3 illustrates conventional wire loops in which

DETAILED DESCRIPTION OF THE PREFERRED EMBODIMENTS

Figure 4:
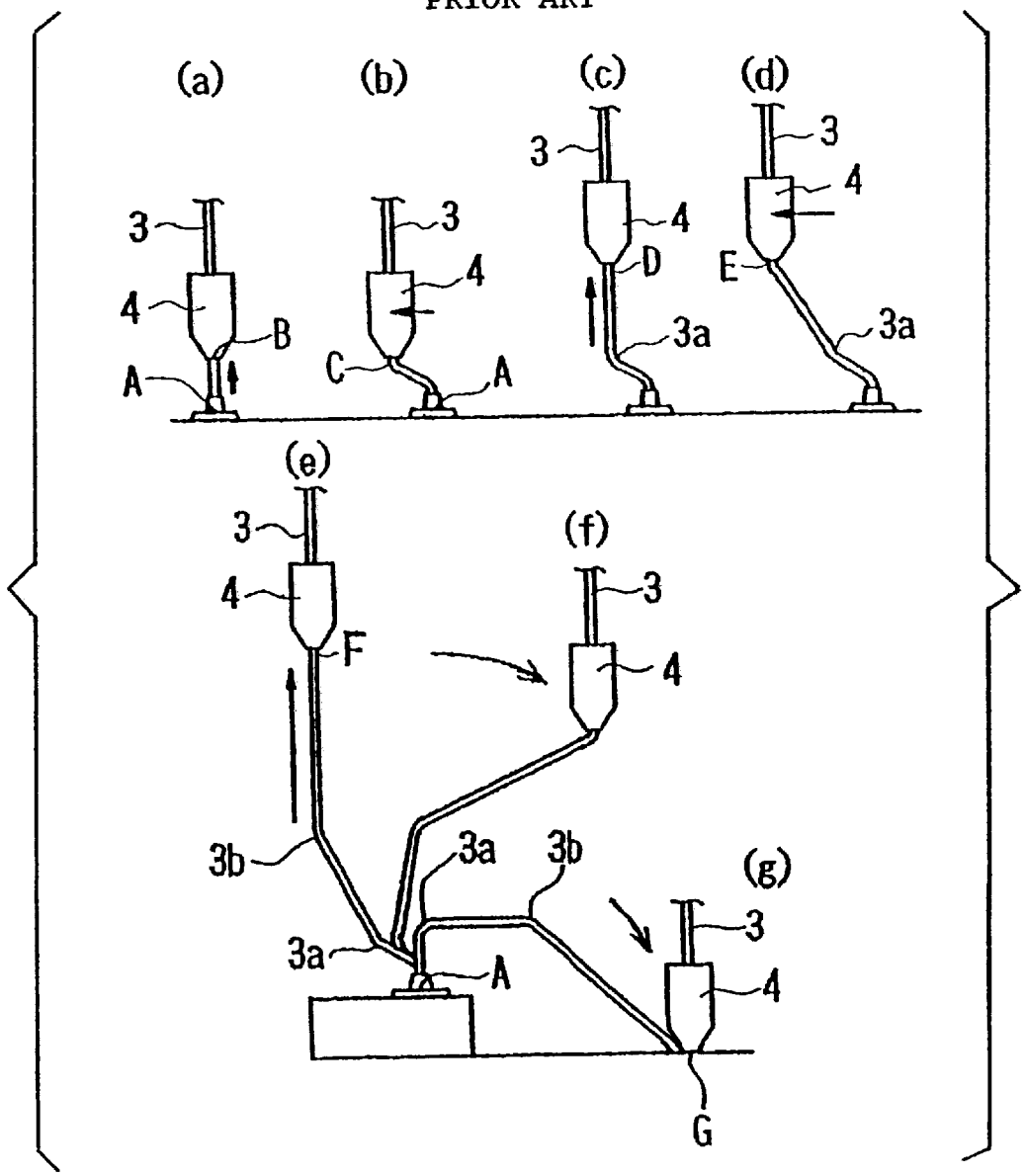
FIG. 4 shows the steps (a) through (g) for forming a conventional triangular wire loop shape shown in FIG. 3(a)
Figure 5:
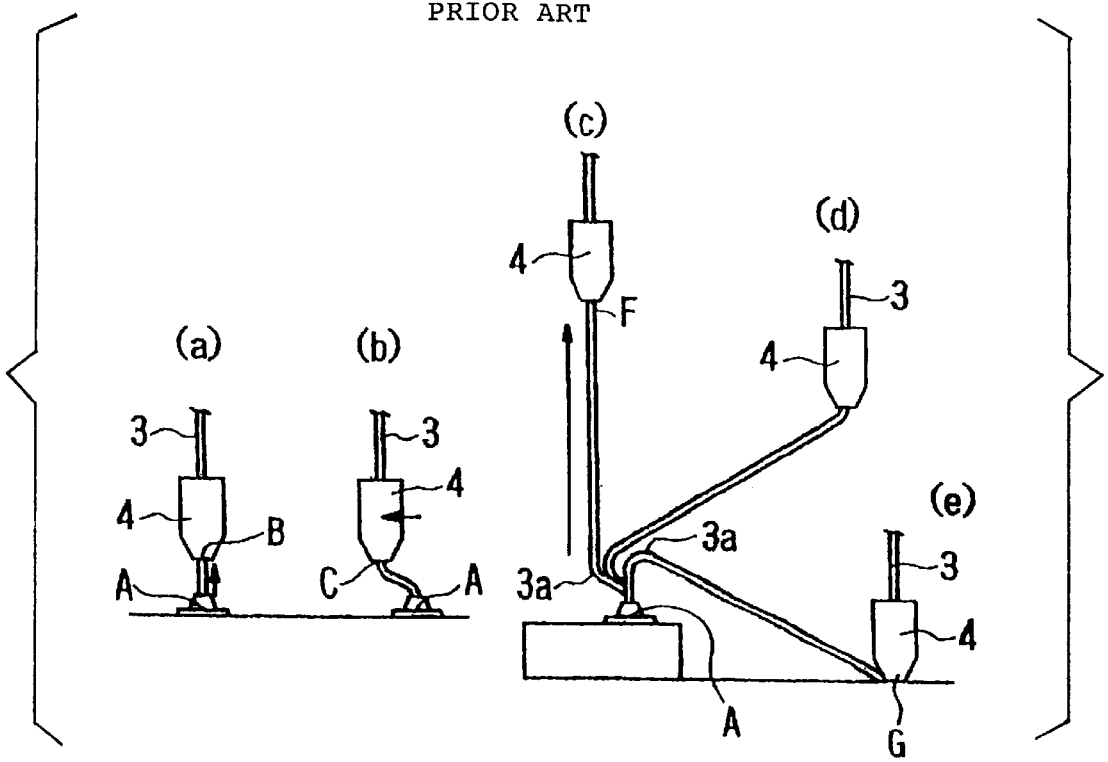
FIG. 5 shows the steps (a) through (e) for forming a conventional triangular loop shown in FIG. 3(b)
Figure 6:
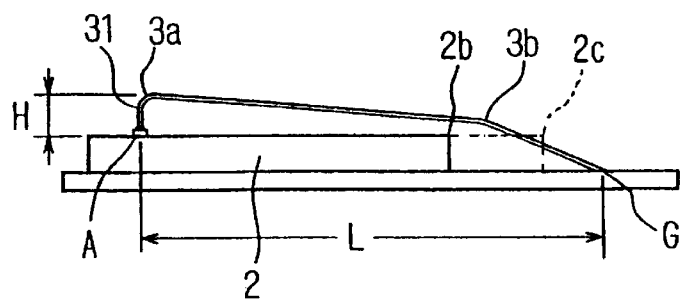
FIG. 6 shows a conventional trapezoidal wire loop shape having a low loop and long wire length.

A semiconductor device according to the present invention will be first described with reference to FIG. 2(b). In this description, the reference numerals of the elements which are the same or correspond to the elements in the prior art device shown in FIG. 4 will be labeled with the same reference numerals.

As seen from FIG. 2(b), the wire connected to the first bonding point A and second bonding point G comprises: a neck height part 31, first, second and third lateral wire parts 35, 36 and 37, and an inclined part 38. Respective kinks 3a, 3c, 3d and 3b are formed in the connecting portion between the neck height part 31 and first lateral wire part 35, the connecting portion between the first lateral wire part 35 and second lateral wire part 36, the connecting portion between the second lateral wire part 36 and third lateral wire part 37, and the connecting portion between the third lateral wire part 37 and inclined part 38.

Figure 3A:
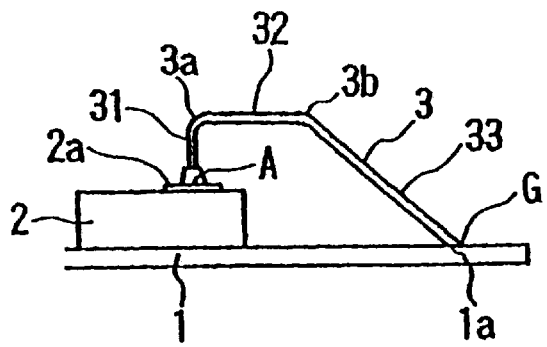
FIG. 3(a) shows a conventional trapezoidal wire loop shape.
Figure 3B:
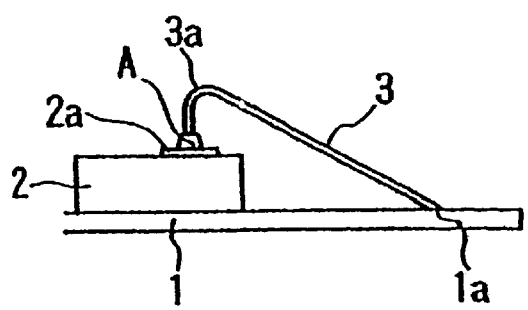
FIG. 3(b) shows a conventional triangular wire loop shape.

More specifically, with the kinks 3c and 3d formed in the wire loop of the present invention in addition to the kinks 3a and 3b seen in conventional examples (see FIGS. 3(a) and 3(b)), the first lateral wire part 35 is formed into a dipping shape, the second lateral wire part 36 is in a substantially horizontal shape, and the third lateral wire part 37 is in a rising shape. In other words, the first lateral wire part 35 is gradually lowered (or closer to the upper surface of the semiconductor chip 2) toward the second bonding point G, the second lateral part 36 is substantially parallel to the upper surface of the semiconductor chip 2, and the third lateral wire part 37 is gradually raised (or graws apart from the upper surface of the semiconductor chip 2) toward the second bonding point G.

Thus, a part of the wire loop located between the top of the neck height part 31 and the top of the inclined part 38 is indented (in other words, it is positioned lower than those tops and closer to the supper surface of the semiconductor chip 2), and the kinks 3c and 3d are formed in such an indented part of the wire loop; accordingly, the wire loop shape provides a high shape-retention force. Moreover, the first lateral wire part 35 dips, the second lateral wire part 36 is set to be more or less horizontal, and the third lateral wire part 37 rises; accordingly, such a wire is prevented from coming into contact with the edge portion 2c of the semiconductor chip 2 even if the wire loop has a low loop shape and a long wire length with such a short distance between the edge 2c and the second bonding point G as, for instance, 300 microns or less.

Next, the wire bonding method of the present invention which provides the wire loop shape described above and a semiconductor device mounted with such a wire loop shape will be described below with reference to FIGS. 1 and 2.

Figure 1:
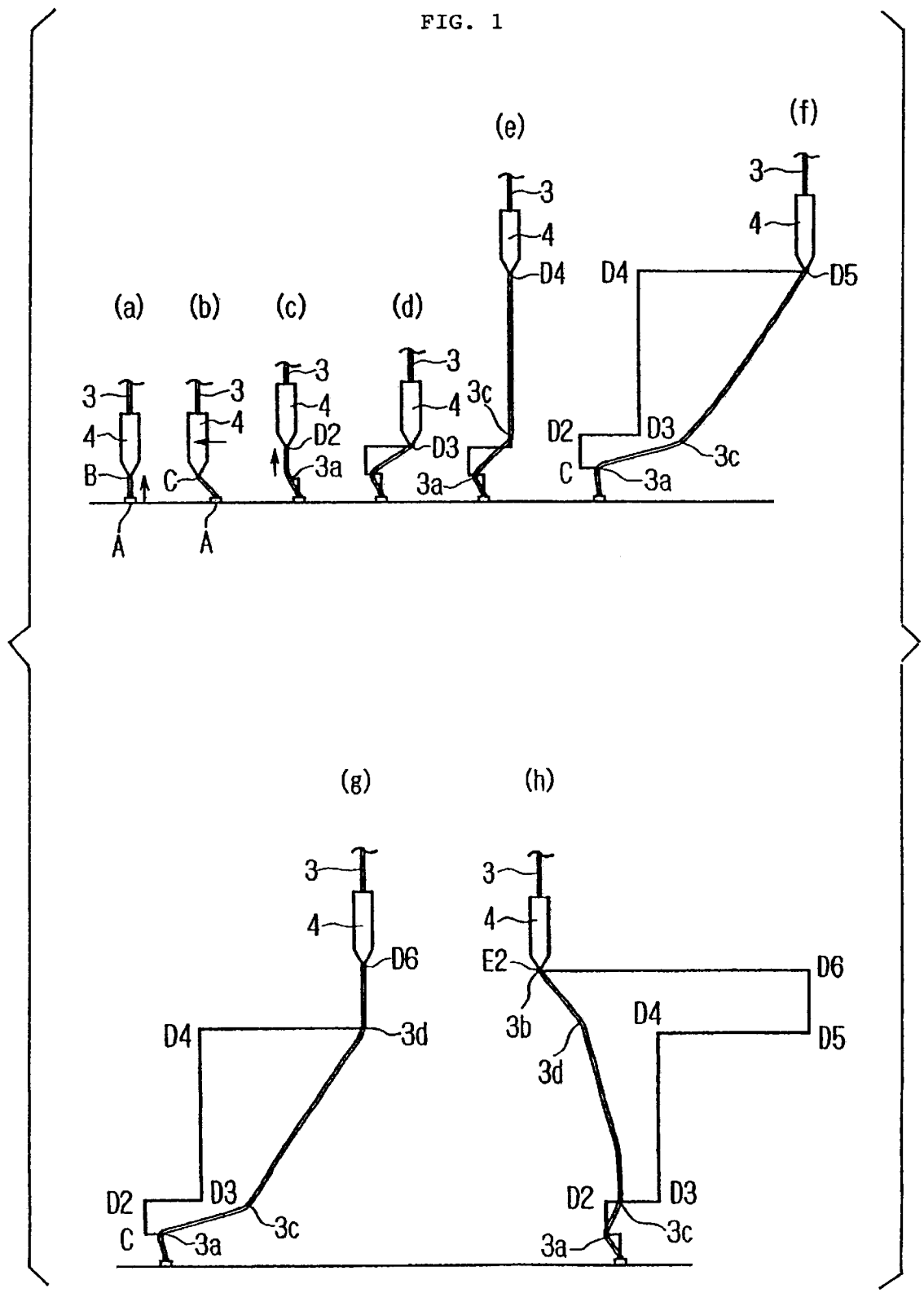
FIG. 1 illustrates the movements of the capillary and the wire shapes effected thereby during the steps (a) through (h) performed by the method of the present invention.
Figure 2:
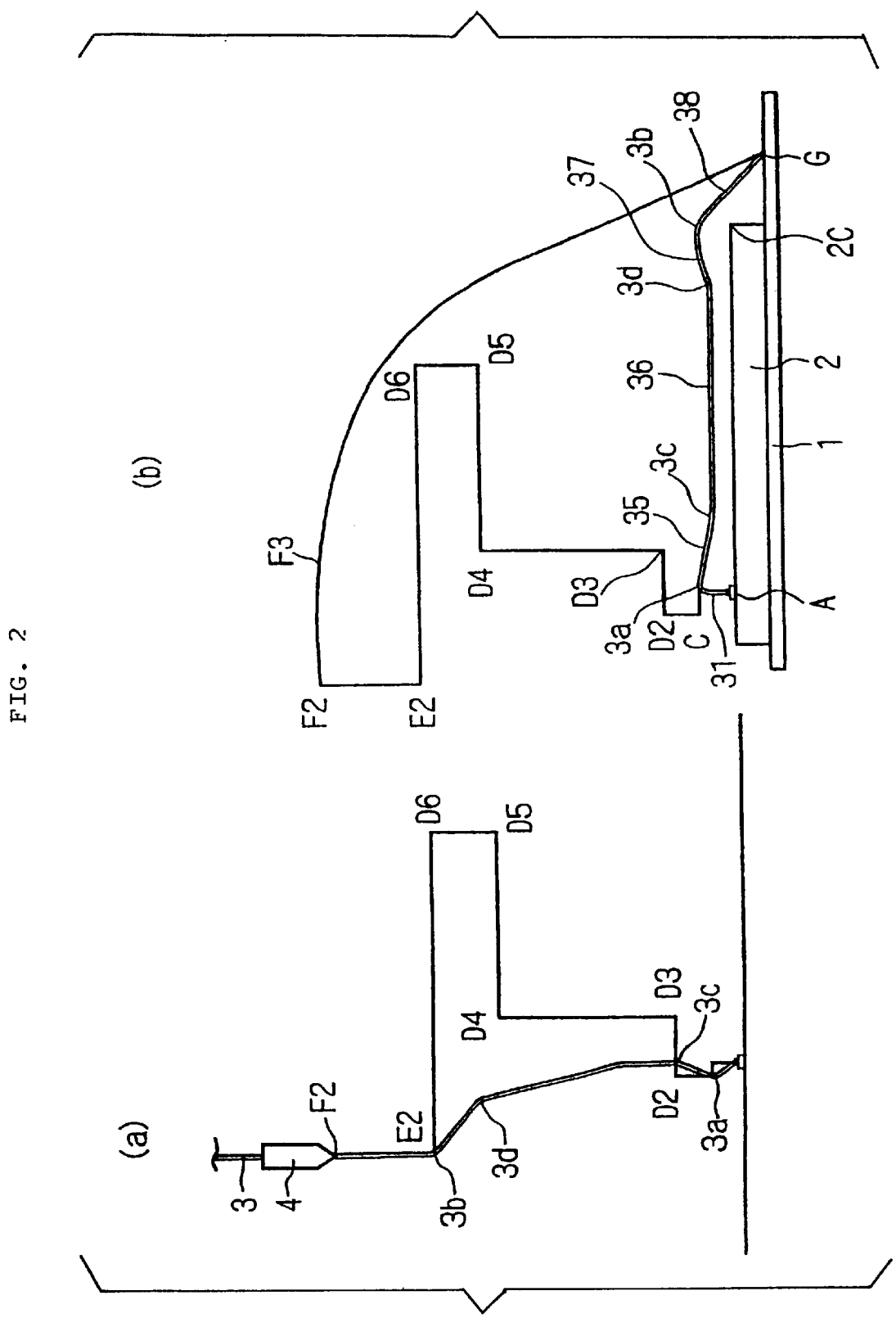
FIG. 2 illustrates the movements of the capillary and the wire shapes effected thereby during the steps performed after the steps shown in FIG. 1.

First, the processes shown in steps (a) and (b) in FIG. 1, which are the same as in a conventional method, are performed. In particular, as shown in step (a) in FIG. 1, the capillary 4 is lowered with a damper (not shown) opened, and a ball formed on the tip of the wire passing through the capillary 4 is bonded to the first bonding point A. Afterward, the capillary 4 is raised to point B, delivering the wire 3.

Next, as shown in step (b), a reverse operation is performed. In other words, the capillary is moved horizontally from the point B to point C in the opposite direction from the second bonding point G. As a result of this reverse operation, a kink 3a is formed in the wire 3 as in a conventional method. The wire 3 delivered in the process of movement of the capillary from point A to point C forms the neck height part 31 (see FIG. 2(b)).

Next, the process which characterizes the present invention is performed.

As shown in step (c) in FIG. 1, the capillary 4 is raised straight up from point C to point D2, delivering the wire 3; and then in step (d), the capillary 4 is moved from point D2 to point D3 in the direction of the second bonding pint G. In step (e), the capillary 4 is raised straight up from point D3 to point D4, delivering the wire 3. As a result of these steps (c) through (e), a kink 3c is formed in the wire 3. The length of the wire delivered during the moving operation of the capillary from point C to point D3 (i.e., the length from the kink 3a to the kink 3c) forms the first lateral wire part 35 (see FIG. 2(b)).

Next, in step (1), the capillary 4 is moved from point D4 to point D5 in the direction of the second bonding point G. Afterward, in step (g), the capillary 4 is raised straight up from point D5 to point D6, delivering the wire 3. As a result of the steps (e) through (g), a kink 3d is formed in the wire 3. Furthermore, the length of the wire delivered in the moving operation of the capillary from point D3 to point D5 (i.e., the length between the kink 3c and the kink 3d) forms the second lateral wire part 36 (see FIG. 2(b)).

Next, in step (h), the capillary 4 is moved horizontally in the opposite direction from the second bonding point G. In other words, a second reverse operation is performed so that the capillary 4 is moved horizontally from point D6 to point E2. As a result of this moving operation of the capillary from point D6 to point E2, a kink 3b is formed in the wire 3. The wire 3 delivered in the operation from point D5 to point E2 forms the third lateral wire part 37 (see FIG. 2(b)).

Next, as shown in FIG. 2(a), the capillary 4 is raised straight up from point E2 to point F2, and an amount of wire 3 that corresponds to the inclined part 38 shown in FIG. 2(b) is delivered. Afterward, the damper (not shown) is closed. When the damper is closed, no wire 3 is delivered even if the capillary 4 is subsequently moved.

Finally, as seen from FIG. 2(b), the capillary 4 is moved horizontally from point F2 to point F3 in the direction of the second bonding point G.

Subsequently, in the same manner as in a conventional method, the capillary 4 is moved from point F3 to the second bonding point G via a circular-arc movement, or by a circular-arc movement followed by a lowering movement, and the wire 3 is bonded to the second bonding point G.

During the moving operation of the capillary from point F2 to the second bonding point G, an operation similar to that disclosed in the prior art can be performed, or various other operations can be performed. For example, the capillary 4 can be moved directly from point F2 to the second bonding point G without being moved to point F3.

Figure 7:
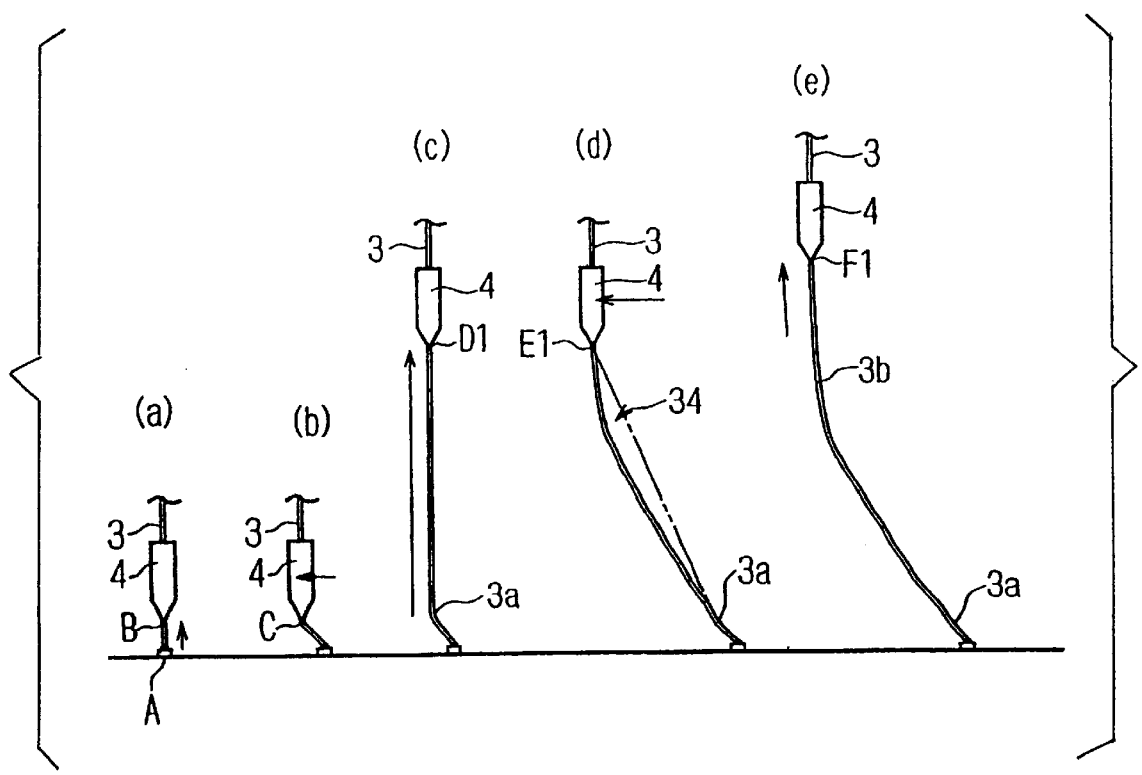
FIG. 7 shows the steps (a) through (e) for forming the wire loop shape shown in FIG. 6.

As seen from the above, the second reverse operation in step (h) is not merely performed as in step (d) shown in FIG. 7 after the capillary 4 has been raised in step (c) in FIG. 7. Instead, in the present invention, after the capillary 4 has been raised in step (c) in FIG. 1, the capillary 4 is moved toward the second bonding point G and then raised in step (e) so that the kink 3c is formed; and further, the capillary 4 is raised in step (e), moved toward the second bonding point G in step (f), and then raised in step (g). After these movements, the second reverse operation is performed in step (h).

Accordingly, kinks 3c and 3d are formed at both ends of the second lateral length part 36 of the wire loop, and thus the second lateral length part 36 is stabilized. Furthermore, since the kink 3b is formed by performing the second reverse operation in step (h) in FIG. 1 following the formation of the kink 3d, this operation to form the kink 3b does not cause any bowing of the portion between the kinks 3d and 3b as in conventional methods. Thus, the kink 3b is stronger than a conventional kink as shown in FIG. 2(b), and the position of the kink 3b can be stabilized. In addition, a wire loop shape with a high shape-retention force is obtained. As a result, the wire 3 does not contact the edge 2c of the semiconductor chip 2 even in cases where the loop is low or the wire length is long, or even in cases where the distance between the edge 2c of the semiconductor chip 2 and the second bonding point G is as short as, for instance, 300 microns or less.

As seen from the above, in the semiconductor device according to the present invention, the shape of the wire loop which connects the first bonding point and second bonding point by a bonding wire comprises: a neck height part which extends substantially in a vertical direction upward from the first bonding point, a first lateral wire part which extends laterally while dipping downward from the neck height part, a second lateral wire part which laterally extends horizontally from the first lateral wire part, a third lateral wire part which laterally extends while rising from the second lateral wire part, and an inclined part which extends from the third lateral wire part to the second bonding point.

Furthermore, according to the wire bonding method of the present invention: the bonding wire is bonded to a first bonding point; a first reverse operation is performed so that the capillary is raised slightly and then moved slightly in the opposite direction from a second bonding point; the capillary is raised and then moved toward the second bonding point; a second reverse operation is performed so that the capillary is raised, moved toward the second bonding point, again raised and then moved in the direction opposite from the second bonding point; and finally, the capillary is raised, moved toward the second bonding point and then bonds the wire to the second bonding point. Accordingly, the method of the present invention provides wire loops that have a stable wire shape and a high shape-retention force.

What is claimed is:

1. A semiconductor device characterized in that a shape of a wire loop connected between a first bonding point and a second bonding point by a wire comprises:
   a neck height part which extends substantially vertically upward from said first bonding point,
   a first lateral wire part which extends laterally while dipping downward from the neck height part,
   a second lateral wire part which extends substantially horizontally from said first lateral wire part,
   a third lateral wire part which extends while rising from said second lateral wire part, and
   an inclined part which extends from said third lateral wire part to said second bonding point.

2. A semiconductor device according to claim 1, wherein respective kinks are formed in a connecting portion between said neck height part and said first lateral wire part, a connecting portion between said first lateral wire part and said second lateral wire part, a connecting portion between said second lateral wire part and said third lateral wire part, and a connecting portion between said third lateral wire part and said inclined part.

* * * * *